US010573992B2

(12) United States Patent
Li et al.

(10) Patent No.: US 10,573,992 B2
(45) Date of Patent: Feb. 25, 2020

(54) CHARGING ADAPTER HAVING DOUBLE SHELLS WITH DIFFERENT PLASTICS

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yong-Qi Li, Kunshan (CN); Jun Chen, Kunshan (CN); Jerry Wu, Irvine, CA (US); Jian-Hui Tan, Kunshan (CN); Yang-Tsun Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/258,547

(22) Filed: Jan. 26, 2019

(65) Prior Publication Data

US 2019/0252816 A1 Aug. 15, 2019

(30) Foreign Application Priority Data

Feb. 9, 2018 (CN) ..................... 2018 2 0230146 U (51) Int. Cl.
*H01R 13/504* (2006.01)
*H01R 13/24* (2006.01)
*H02J 7/00* (2006.01)
*H01R 13/717* (2006.01)
*H01R 13/62* (2006.01)
*H01R 31/06* (2006.01)

(52) U.S. Cl.
CPC ........... *H01R 13/504* (2013.01); *H01R 13/24* (2013.01); *H01R 13/6205* (2013.01); *H01R 13/7175* (2013.01); *H02J 7/0042* (2013.01); *H01R 31/065* (2013.01)

(58) Field of Classification Search
CPC .. H01R 13/6205; H01R 13/504; H01R 13/24; H01R 13/7175; H01R 11/30; H01R 31/065; H02J 7/0042
USPC .............................................. 439/39–40, 606
See application file for complete search history.

(56) References Cited

U.S. PATENT DOCUMENTS

| 7,963,773 | B2 * | 6/2011 | Palli | H01R 13/6205 |
| | | | | 439/38 |
| 9,017,092 | B1 * | 4/2015 | McCracken | H01R 13/62 |
| | | | | 439/374 |
| 9,252,543 | B2 * | 2/2016 | Huang | H01R 13/7175 |
| 9,548,559 | B2 * | 1/2017 | Zhou | H01R 13/6205 |

FOREIGN PATENT DOCUMENTS

CN 106159525 A 11/2016
CN 107240839 A 10/2017

* cited by examiner

*Primary Examiner* — Hien D Vu
(74) *Attorney, Agent, or Firm* — Wei Te Chung; Ming Chieh Chang (57) ABSTRACT

A charging adapter comprises an insulative case and a circuit board assembly. The insulative case includes a first case and a second case, and defining a receiving cavity between the first and second cases. The circuit board assembly is retained in the receiving cavity. Each of the first and second cases comprises an inner shell and an outer shell molded together. The inner shells are made from hard plastic, and the outer shells are made from soft plastic.

12 Claims, 8 Drawing Sheets

FIG. 8

CHARGING ADAPTER HAVING DOUBLE SHELLS WITH DIFFERENT PLASTICS

BACKGROUND OF THE INVENTION

1. Field of the Invention

The present invention relates generally to a charging adapter, and more particularly to a charging adapter having double shells constructed with different plastics.

2. Description of Related Arts

U.S. Pat. No. 9,548,559 discloses a connector assembly. The connector assembly has an insulative housing, a plurality of contacts soldered with a printed circuit received in a receiving cavity defined in the insulative housing. Two magnets are retained in two opposite ends of the housing. An insulative cover is retained in an rear end of the insulative housing. However, the single shell can only stably hold the above components without elasticity.

An improved charging adapter is desired.

SUMMARY OF THE INVENTION

An object of the present invention is to provide a charging adapter equipped with double shells constructed with different plastics.

To achieve the above-mentioned object, a charging adapter comprises an insulative case and a circuit board assembly. The insulative case includes a first case and a second case, and defining a receiving cavity between the first and second cases. The circuit board assembly is retained in the receiving cavity. Each of the first and second cases comprises an inner shell and an outer shell molded together. The inner shells are made from hard plastic, the outer shells are made from soft plastic.

DETAILED DESCRIPTION OF THE PREFERRED EMBODIMENT

Referring to FIGS. 1-6, a charging adapter 100 of an embodiment of this invention, includes an insulative case 1 and a circuit board assembly 2 retained in the case 1. The insulative case 1 includes a first or lower case 3 and a second or upper case 4. The circuit board assembly 2 includes a circuit board 41 and two magnets 42 located in notched at wing portion 410 extending from the both side of the circuit board 41 and retained in the holes 502 defined in the lower case 3 and press against the inner face 402 of the upper case 4. The lower case 3 includes an outer shell 5 and an inner shell 6. The upper case 4 includes an outer shell 8 and an inner shell 7. The inner shells 6, 7 are made from a hard plastic, and the outer shells 5, 8 are made from a soft plastic. The soft outer shells are a friendly-user case, i.e., a good hand sense, and the inner shells offer an improved strengthened structure to protect the inner elements, such as magnets and the circuit board.

Figure 1:
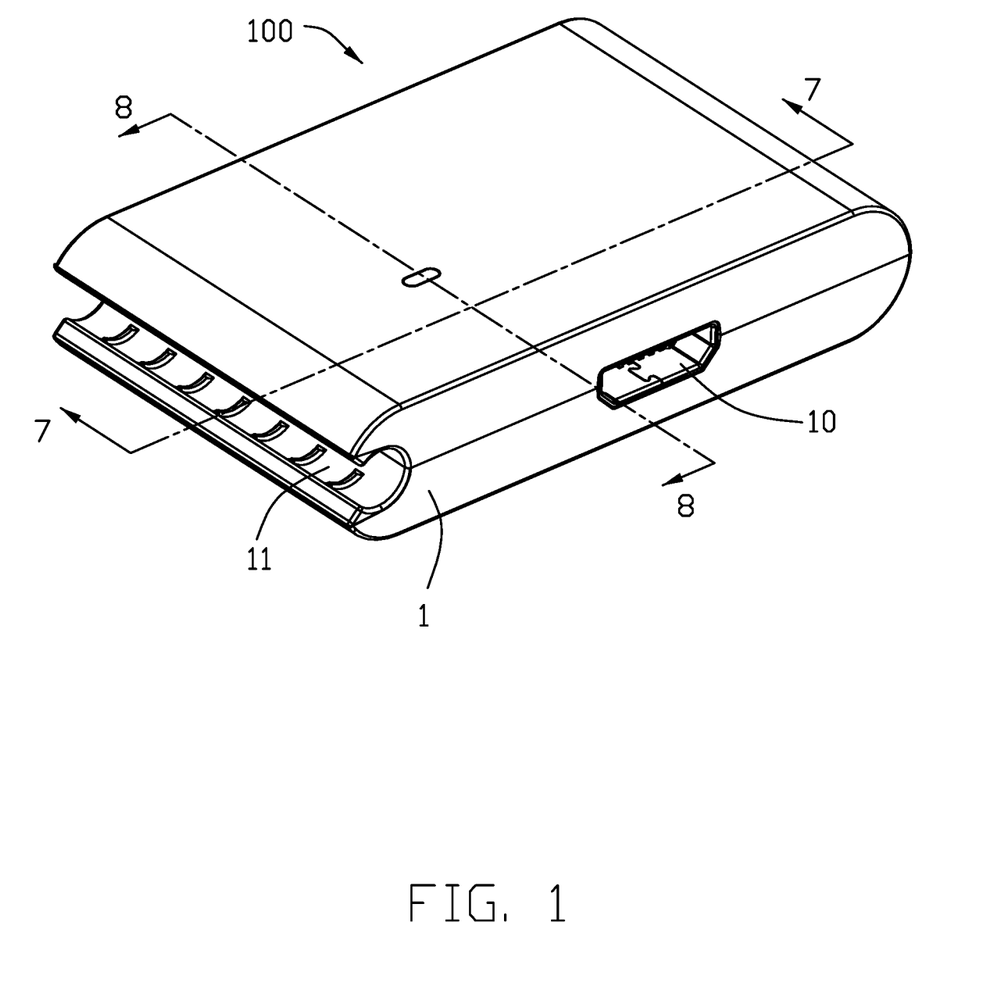
FIG. 1 is a top and front perspective view of a charging adapter according to an embodiment of the present invention.
Figure 2:
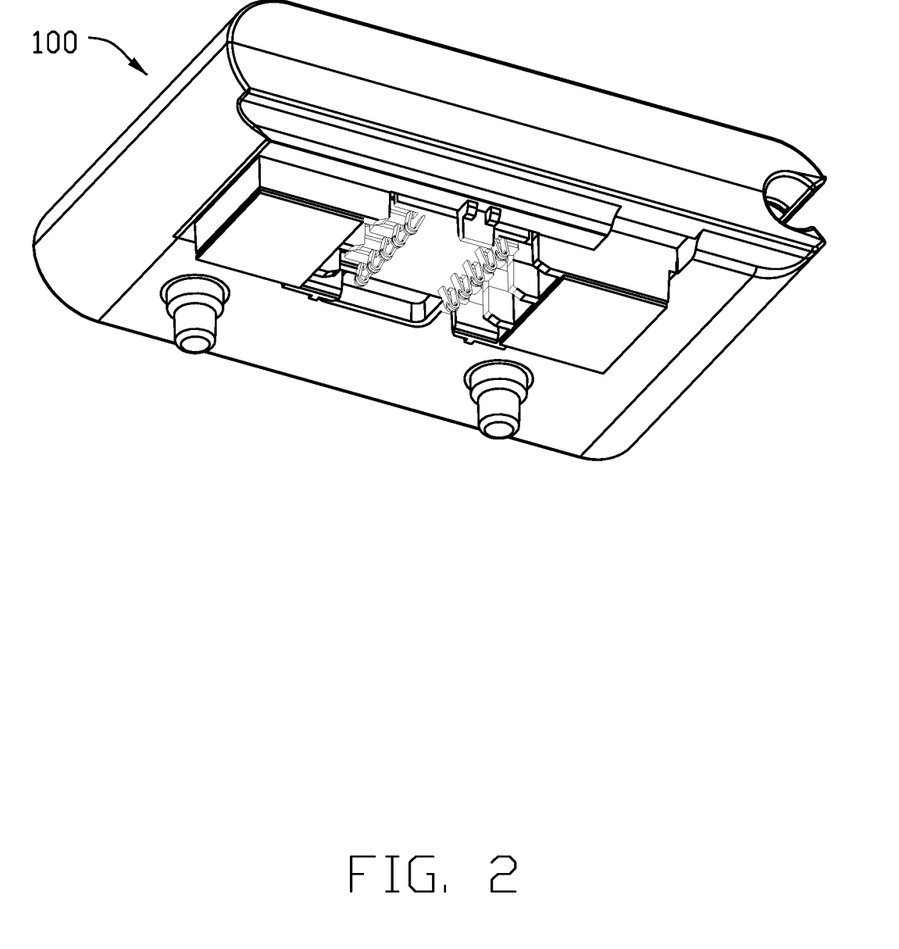
FIG. 2 is a bottom and rear perspective view of the charging adapter of FIG. 1.
Figure 3:
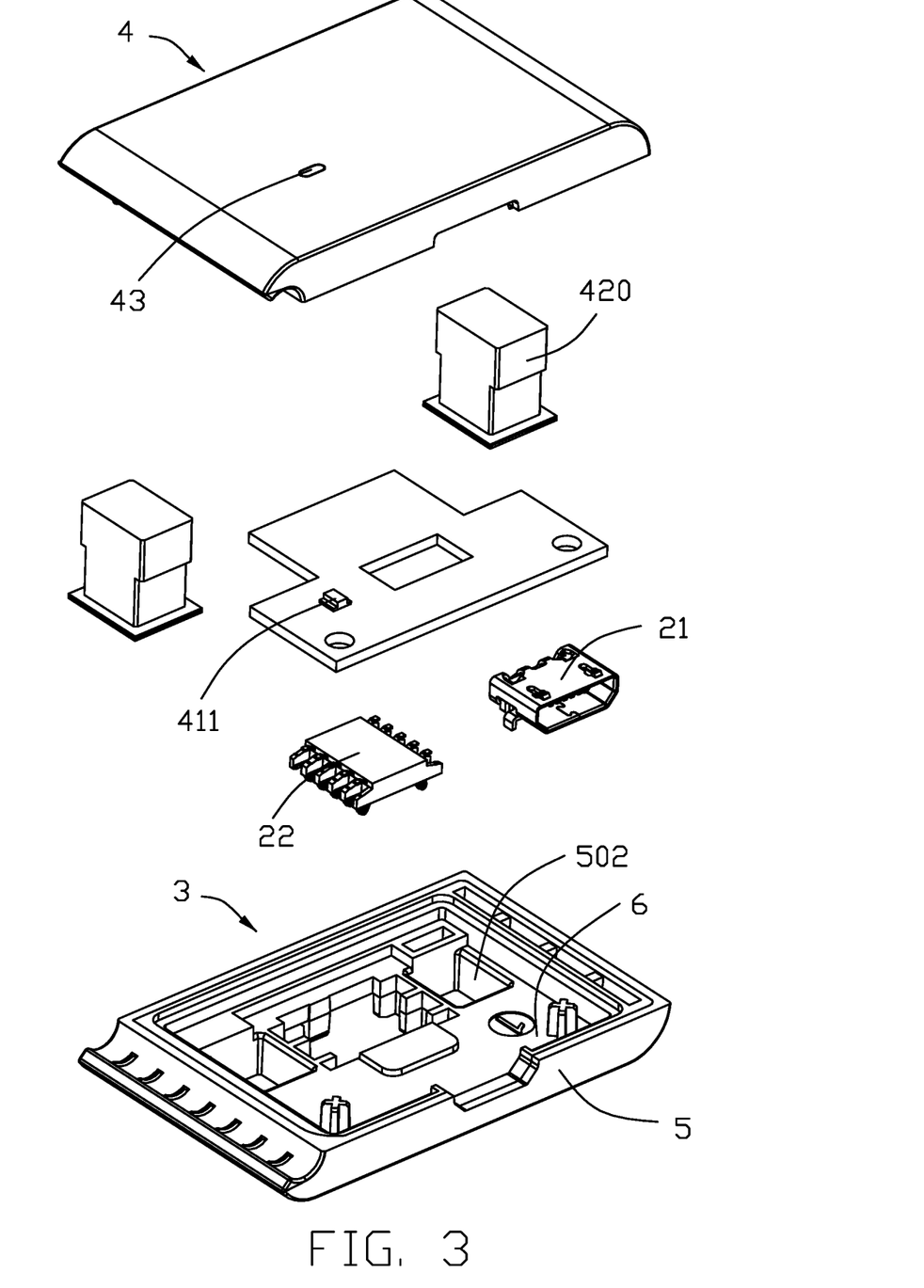
FIG. 3 is an exploded perspective view of the charging adapter of FIG. 1.

Referring to FIGS. 2-3, the lower case 3 is formed by two-color injection molding with the inner shell 6 and the outer shell 5. The upper case 4 includes an inner shell 7 corresponding to the inner shell 6 and an outer shell 8 corresponding to the outer shell 5. The inner shell 7 is a hard plastic, and the outer shell 5 is a soft plastic. The upper case 4 is formed by two-color injection molding with the inner shell 7 and the outer shell 8. The hard plastic is PC/ABS, and the soft plastic is TPU. Two-color injection molding reduces the time in assembly operations of the inner and outer shells, and also improves the connection of the inner and outer shells.

Figure 6:
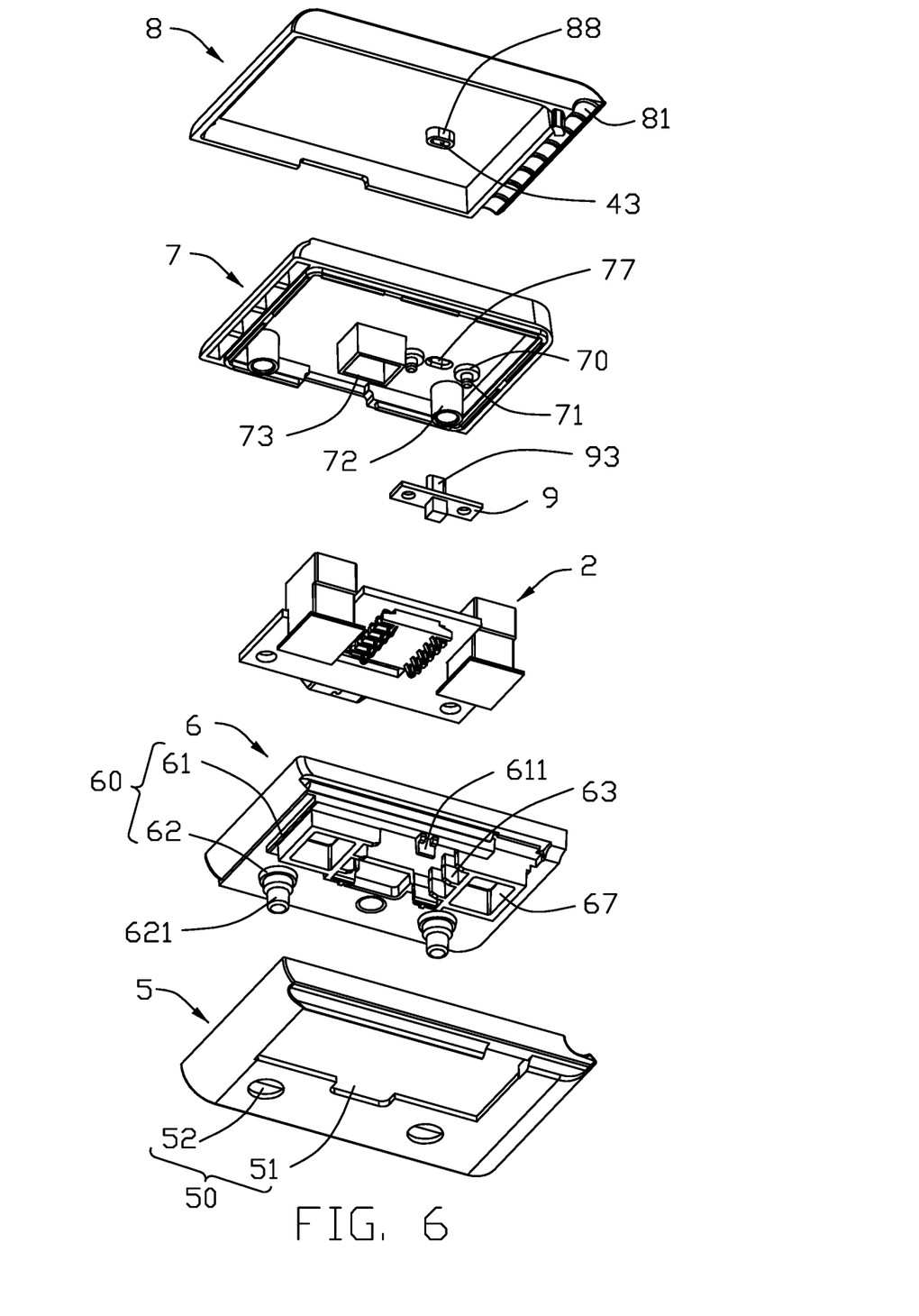
FIG. 6 is an exploded perspective view of the charging adapter of FIG. 2.
Figure 7:
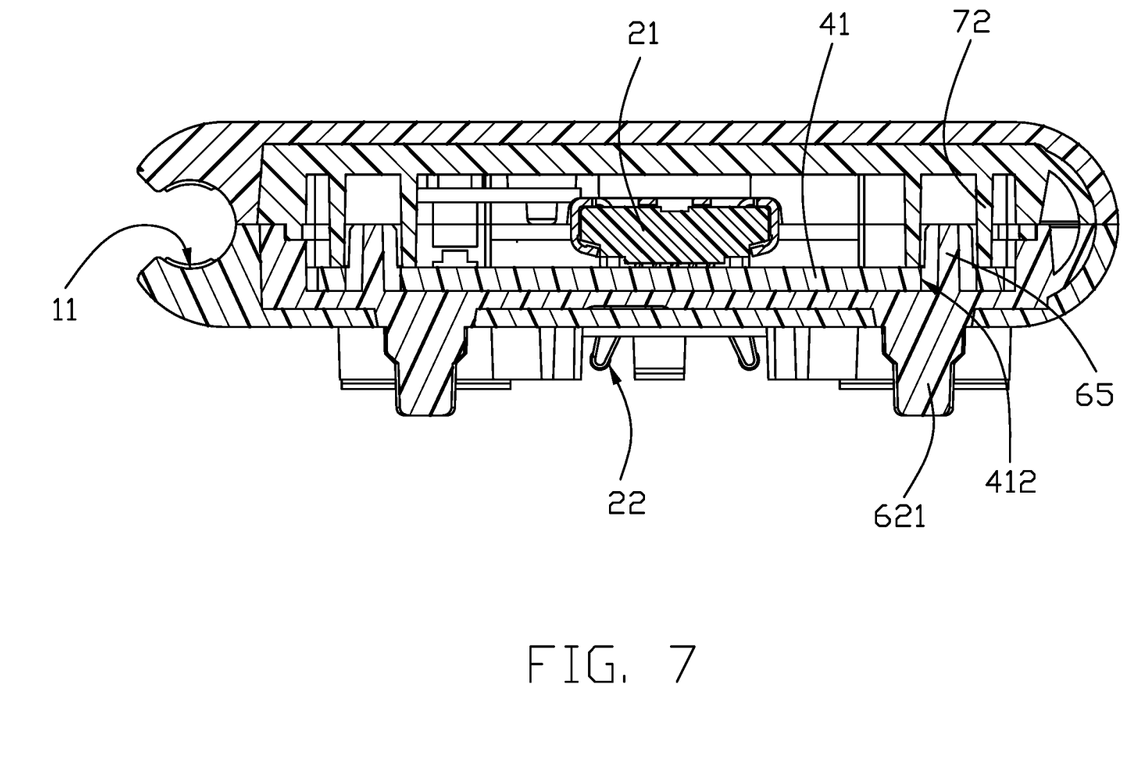
FIG. 7 is a cross-sectional view of the charging adapter of FIG. 1 to show how the circuit board is sandwiched between two inner shells.
Figure 8:
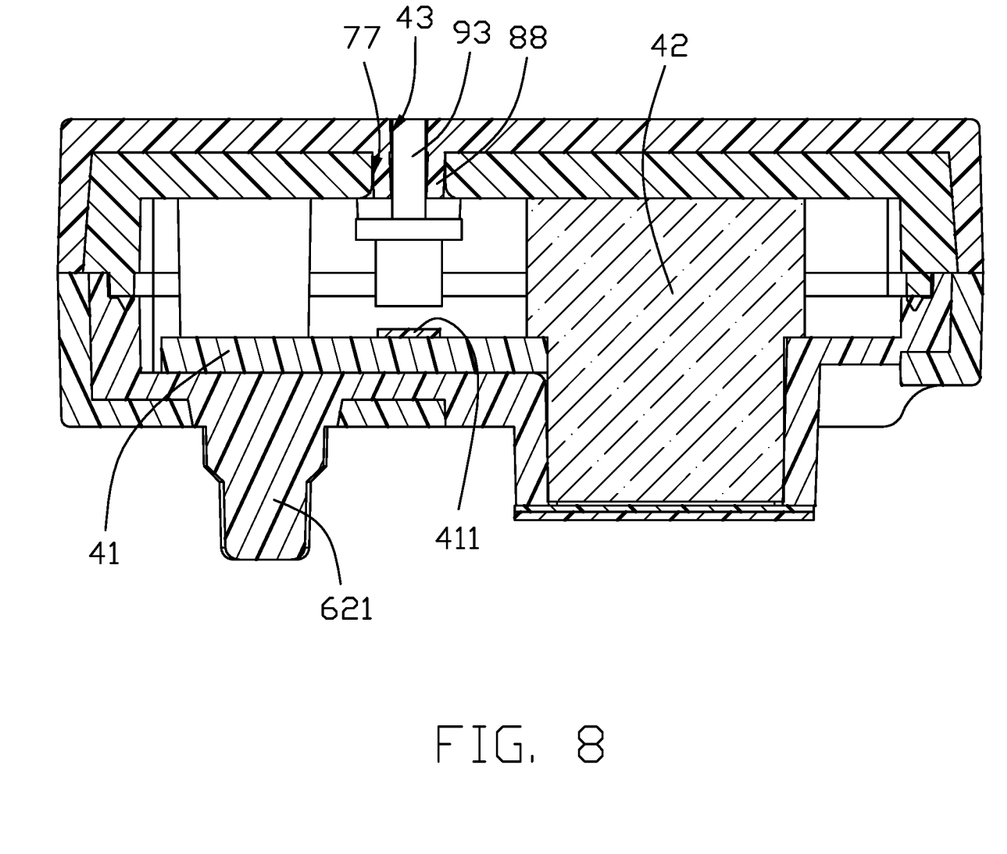
FIG. 8 is another cross-sectional view of the charging adapter of FIG. 1 to show how the light guiding member transmits the light from the LED.

Referring to FIG. 6, the inner shell 6 has a plurality of tubers 60 extending downwardly from a lower surface thereof. The outer shell 5 defines a plurality of openings 50 corresponding to the tubers 60. The tubers 60 are combined with the openings 50 one by one. Each of the tubers 60 includes a first tuber 61 and two second tubers 62. The first tuber 61 is square, and the second tubers 62 are circular. Each of the openings 50 includes a first opening 51 corresponding to the first tuber 61 and a second opening 52 corresponding to the second tuber 62. The inner shell 6 has a column 621 extending downwardly from the second tuber 62, through the corresponding opening 52 of the outer shell 5, and further beyond an exterior of the outer shell 5 for engagement with an external part (not shown), and a latch 611 extending downwardly from the first tuber 61.

The outer shells of the upper and lower cases 3, 4 commonly define a cable slot 11 at one side thereof. Because of the soft plastic, the cable slot 11 can prevent the cable from being damaged by the squeeze.

Referring to FIGS. 3-6, the circuit board 2 is disposed with a LED 411 thereof, for indicating working states of the charging adapter 100. The charging adapter 100 includes a light guiding member 9 located above the LED 411. A mounting plate 90 is deposed to fix the light guiding member 9. The mounting plate 90 defines two holes 91 running through the both sides thereof. The upper case 4 defines a mounting hole 43, and the upper end of the light guiding member 9 is received in the mounting hole 43. The inner shell 7 has a cylinder 70 extending downwardly from the inner shell 7. The inner shell 7 has two posts 71 extending downwardly from the cylinder 70 to cooperate with the holes 91. The mounting plate 90 abuts against the cylinder 70. The posts 71 are melted by heat and then fixed to the light guiding member 9 via solidification. The light guiding member 9 is fixed to the upper case 4 by hot melt connection, ensuing the stable connection between the light guiding member 9 and the upper case 4. Understandably, the bottom of the light guiding member 9 is aligned with the LED 411 in the vertical direction.

Figure 4:
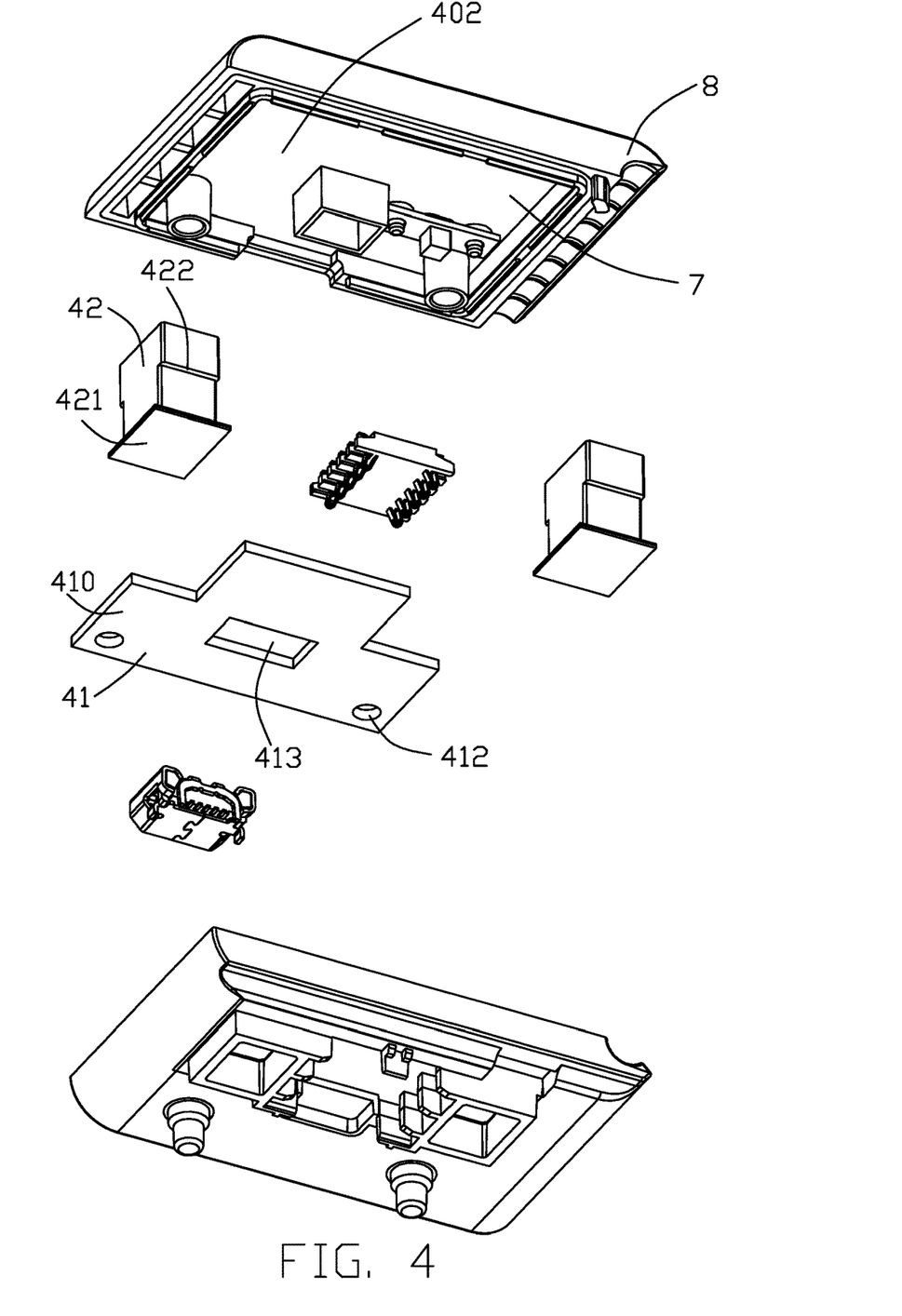
FIG. 4 is an exploded perspective view of the charging adapter of FIG. 2.

Referring to FIG. 3 and FIG. 4, the circuit board assembly 2 further includes an inputting electrical connector 21 and an outputting terminal module or connector 22. The terminal module 22 is located between two magnets 42. Each of the magnets 42 has a first embossing portion 420 extending from the front side thereof and a second embossing portion 422 opposite the first embossing portion 420. Referring to FIG. 2, a square plate 421 represents a surface of a mating connector attracted by the magnets 42. The second embossing portion 422 abuts against the wing portion 410, and the magnets 42 abut against the side of the circuit board 41. The electrical connector 21 is located on the upper surface of the circuit board 41 and at the front end thereof. The insulative case 1 defines a mounting opening 10 surrounding the electrical connector 21. The terminal module 22 is located on the lower surface of the circuit board 41 and at the rear end thereof. The wing portion 410 defines a circular hole 412 running through the circuit board 41 along the vertical direction.

Figure 5:
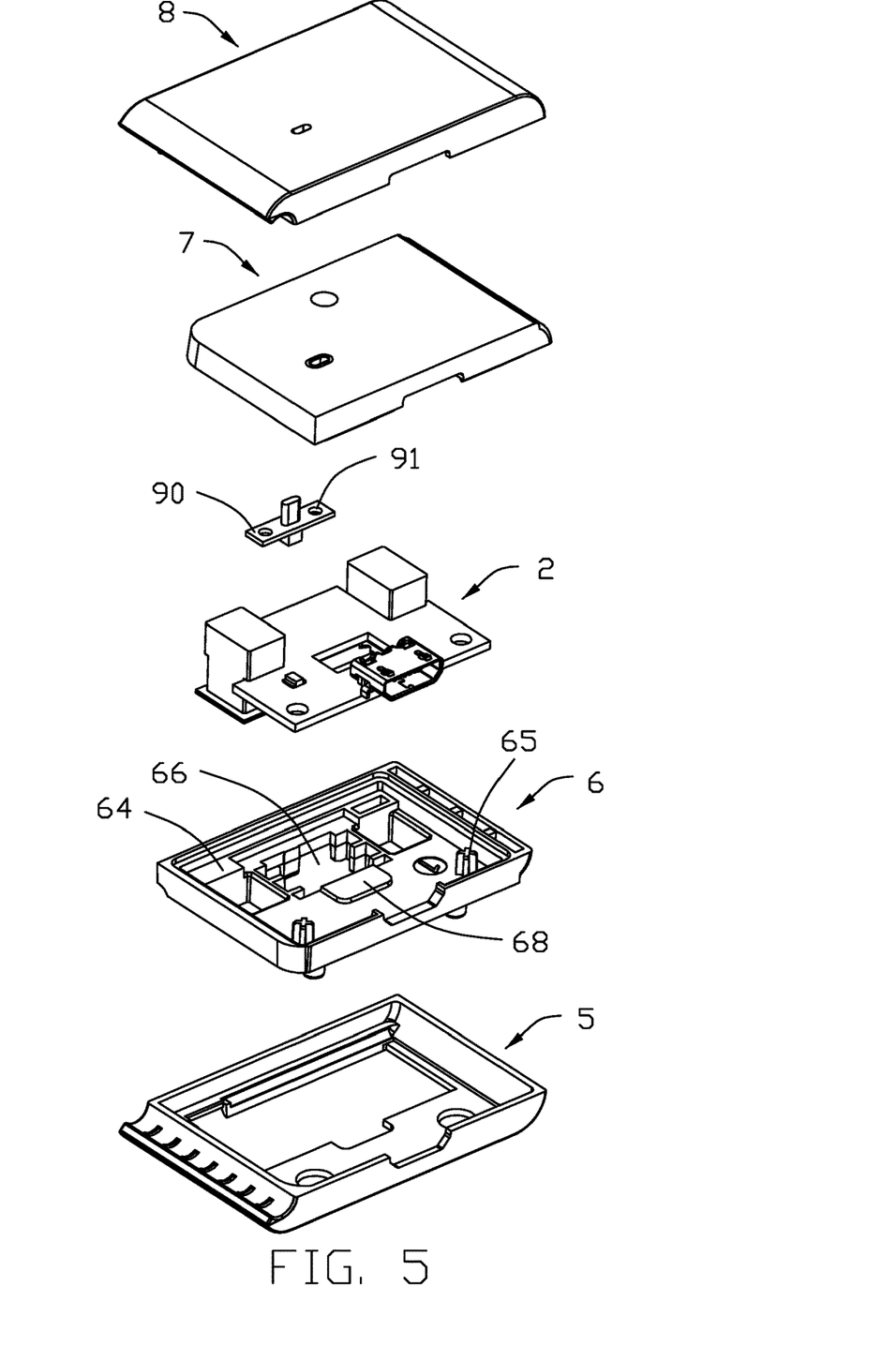
FIG. 5 is an exploded perspective view of the charging adapter of FIG. 1.

Referring to FIGS. 5-6, the holes 502 is two grooves 67 running through the first tuber 61. The inner shell 6 has two positioning posts 65 and two positioning tubers 64. Each of the positioning tubers 64 abuts against the first embossing portion 420. The inner shell 7 has two hollow cylinders 72 corresponding to the positioning posts 65. The circuit board 4 is held by the positioning posts 65 and the hollow cylinders 72. The inner shell 6 defines a cavity 66 between the grooves 67. The terminal module 22 is exposed to the cavity 66. The cavity 66 deposes a plurality of symmetrical guiding ribs 63 to guide the mating connector.

The outer shell 8 unitarily forms a downwardly extending tubular retainer 88 with the hole 43 therein. The inner shell 7 forms a hole 77 receiving the tubular retainer 88 therein. The head 93 of the light guiding member 9 extends upwardly into the hole 43 with an upper end exposed upon an interior surface of the outer shell 8 for indication. Understandably, the head 93 of the light guiding member 9 is delicately protectively in the tubular retainer 88 due to relative softness of the outer shell 8 compared with the inner shell 7. The inner shell 6 has a protruding portion 68 received in a positioning opening 413 defined in the circuit board 41. The thickness of the protruding portion 68 is smaller than the thickness of the circuit board 41. The inner shell 7 has a board lock 73 abutting against the upper surface of the circuit board 41. The protruding portion 68 and the positioning opening 413 prevent the circuit board 41 from swaying laterally, and the board lock 73 prevents the circuit board 41 from being loosened up and down. The convenience of assembly is improved by mechanical fixing, and reducing the cost.

However, the disclosure is illustrative only, changes may be made in detail, especially in matter of shape, size, and arrangement of sections within the principles of the invention.

What is claimed is:

1. A charging adapter comprising:
an insulative case including a first case and a second case, and defining a receiving cavity between the first and second cases;
a circuit board assembly retained in the receiving cavity;
wherein each of the first and second cases comprises an inner shell and an outer shell molded together, the inner shells are made from hard plastic, the outer shells are made from soft plastic;
wherein each of the first and second cases is a two-color injection molding by the inner shell and the outer shell are formed by an injection molding process;
wherein the circuit board assembly is disposed with an LED thereof, for indicating a working status of the charging adapter;
wherein a light guiding member is located above the LED, the light guiding member is received in a mounting hole defined on the second case; and
wherein the inner shell of the first case defines two holes and magnets are received in corresponding holes.

2. The charging adapter as claimed in claim 1, wherein the inner shell and the outer shell are different in color.

3. The charging adapter as claimed in claim 1, wherein the inner shell of the first case defines a plurality of tubers going across corresponding openings defined on the outer shell of the first case.

4. The charging adapter as claimed in claim 1, wherein the outer shells of the first and second case commonly define a cable slot at one side thereof.

5. The charging adapter as claimed in claim 1, wherein the inner shell of the second case defines two posts extending downwardly and melted by heat and then fixed to the light guiding member.

6. A charging adapter comprising:
a case made from plastic and including a first case and a second case, and a receiving cavity defines between the first and second cases;
a circuit board assembly retained in the receiving cavity;
wherein each of the first and second cases comprises an inner shell and an outer shell, and each inner shell is hard while each outer shell is soft;
wherein the inner shells of the first and second case differ from the outer shells of the first and second case in color;
wherein the circuit board assembly is disposed with an LED thereof, for indicating a working status of the charging adapter;
wherein a light guiding member is located above the LED, the light guiding member is received in a mounting hole defined on the second case; and
wherein the inner shell of the first case defines two holes and magnets are received in corresponding holes.

7. A charger adapter comprising:
an insulative case defining a receiving cavity to receive a circuit board assembly;
the insulative case is essentially composed an inner shell and an outer shell via a two shots injection molding process;
wherein the inner shell is harder than the outer shell materially;
wherein the inner shell and the outer shell are different in color;
wherein the inner shell includes a tuber extending through an opening of the outer shell and beyond an exterior surface of the outer shell for engagement with an exterior part;
wherein the outer shell includes a tubular retainer extending through a corresponding hole formed in the inner shell, and a light guiding member has a head extending through said tubular retainer with an upper end exposed upon an exterior surface of the outer shell; and
wherein the inner shell has two opposite parts to define the receiving cavity, and at least a connector mounted on the circuit board assembly and exposed to an exterior for mating with a complementary connector.

8. The charger adapter as claimed in claim 7, wherein one of said two parts forms a post extending through a through hole in the circuit board and into a cylinder form on the other of said two parts.

9. The charger adapter as claimed in claim 7, wherein there are two connectors mounted upon the circuit board assembly, of which one communicates with the exterior horizontally and the other communicates with the exterior vertically.

10. The charger adapter as claimed in claim 7, wherein two magnets are located by two sides of the connector.

11. The charger adapter as claimed in claim 10, wherein the inner shell forms two grooves snugly receiving said two magnets, respectively.

12. The charger adapter as claimed in claim 7, wherein the insulative case defines a cable slot in one side to communicate with the exterior laterally.

\* \* \* \* \*